United States Patent
Choi

(10) Patent No.: US 9,316,879 B2
(45) Date of Patent: Apr. 19, 2016

(54) DISPLAY APPARATUS AND METHOD OF MANUFACTURING THE SAME

(71) Applicant: Samsung Display Co., Ltd., Yongin (KR)

(72) Inventor: Sunghwan Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 65 days.

(21) Appl. No.: 14/092,096

(22) Filed: Nov. 27, 2013

(65) Prior Publication Data

US 2015/0024529 A1 Jan. 22, 2015

(30) Foreign Application Priority Data

Jul. 22, 2013 (KR) ........................ 10-2013-0086197

(51) Int. Cl.
| | |
|---|---|
| H01L 21/00 | (2006.01) |
| G02F 1/1362 | (2006.01) |
| H01L 27/32 | (2006.01) |
| H01L 29/08 | (2006.01) |
| H01L 35/24 | (2006.01) |
| H01L 51/00 | (2006.01) |
| G02F 1/136 | (2006.01) |

(52) U.S. Cl.
CPC .... G02F 1/136286 (2013.01); G02F 1/136259 (2013.01); H01L 27/3276 (2013.01); *G02F 2001/13629* (2013.01); *G02F 2001/136263* (2013.01); *G02F 2001/136295* (2013.01); *G02F 2202/06* (2013.01)

(58) Field of Classification Search
None
See application file for complete search history.

(56) References Cited

U.S. PATENT DOCUMENTS

| 7,977,128 B2 | 7/2011 | Cho et al. | |
|---|---|---|---|
| 8,299,529 B2 | 10/2012 | Takasawa et al. | |
| 2005/0140836 A1* | 6/2005 | Choi | 349/40 |
| 2006/0283833 A1 | 12/2006 | Lee et al. | |
| 2008/0044963 A1* | 2/2008 | Cho et al. | 438/160 |
| 2011/0157507 A1* | 6/2011 | Koh | 349/43 |
| 2011/0168986 A1* | 7/2011 | Lee et al. | 257/40 |

(Continued)

FOREIGN PATENT DOCUMENTS

| JP | 2007-224397 | 9/2007 |
|---|---|---|
| KR | 10-2007-0025214 | 3/2007 |

(Continued)

OTHER PUBLICATIONS

C.K. Hu and J.M.E. Harper, "Copper interconnections and reliablity", Materials Chemistry and Physics, 52(1), (1998), pp. 5-16, Elsevier Science S.A.

(Continued)

*Primary Examiner* — Calvin Choi
(74) *Attorney, Agent, or Firm* — H.C. Park & Associates, PLC

(57) ABSTRACT

A display apparatus includes a base substrate, a data line to transmit a data signal, a gate line disposed on the base substrate and insulated from the data line, and a pixel electrically connected to the gate line and/or the data line via a thin film transistor. At least one of the data line and the gate line includes a lower conductive layer and an upper conductive layer. The lower conductive layer includes a zinc oxide doped with a doping material. The upper conductive layer is disposed on the lower conductive layer and includes a copper, and the upper conductive layer includes crystals in which growth directions are dispersed by the doping material.

20 Claims, 10 Drawing Sheets

(56) References Cited

U.S. PATENT DOCUMENTS

2011/0186843 A1    8/2011   Kim et al.
2011/0309444 A1    12/2011  Maki et al.
2013/0174892 A1*   7/2013   Ganjoo et al. ............... 136/252

FOREIGN PATENT DOCUMENTS

| KR | 10-2007-0088886 | 8/2007 |
| KR | 10-2008-0012490 | 2/2008 |
| KR | 10-2008-0102664 | 11/2008 |
| KR | 10-2010-0065555 | 6/2010 |

OTHER PUBLICATIONS

Y.H. Park, A.H. Chung and M. A. Ward, "Step Coverage Evaluation of Copper Films Prepared by Magnetron Sputtering", VMIC Conference, Jun. 11-12, 1991, pp. 295-297, VLSI Multilevel Interconnection Conference, Eighth International IEEE, Santa Clara, California.

Nobuyoshi Awaya and Toshio Koyayashi, Self-Aligned Passivation Technology for Copper Interconnection Using Copper-Aluminum Alloy, Jpn. J. Appl. Phys. vol. 36, Mar. 1997, Part 1, No. 3B,, pp. 1548-1553, Japan.

Xinjian Wang et. al., "Morphology and microstructure control of sputter-deposited copper films by addition of Cr", Journal of Physics: Conference Series 152 (2009) 012006, Symposia D, E and F from MRS International Material Research Conference, IOP Publishing, China.

Yu-Yun Chen, et al., "Post-annealing properties of aluminum-doped zinc oxide films fabricated by ion beam co-sputtering", Elsevier, 2013, pp. 227-231, vol. 87.

* cited by examiner

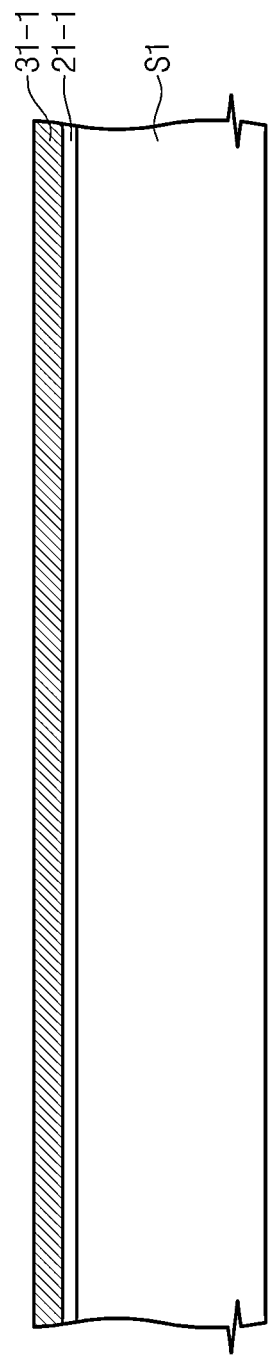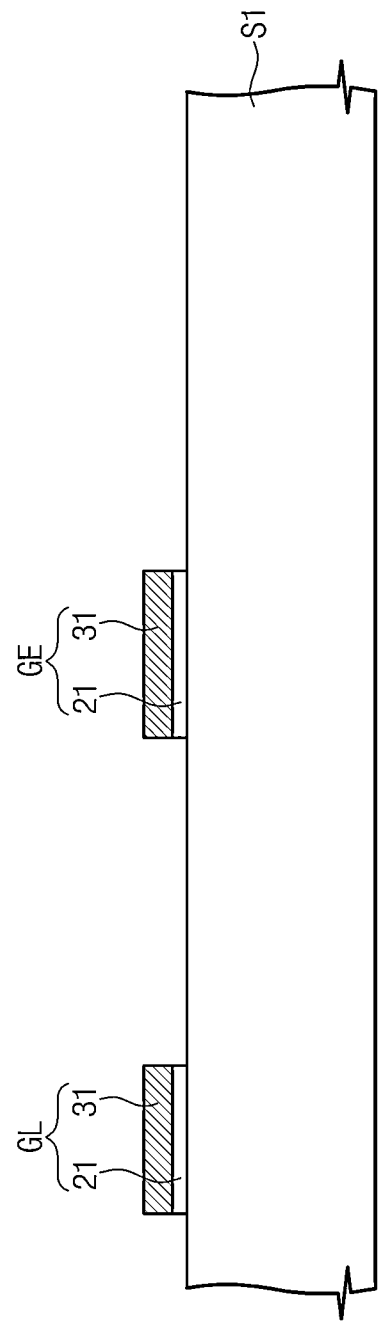

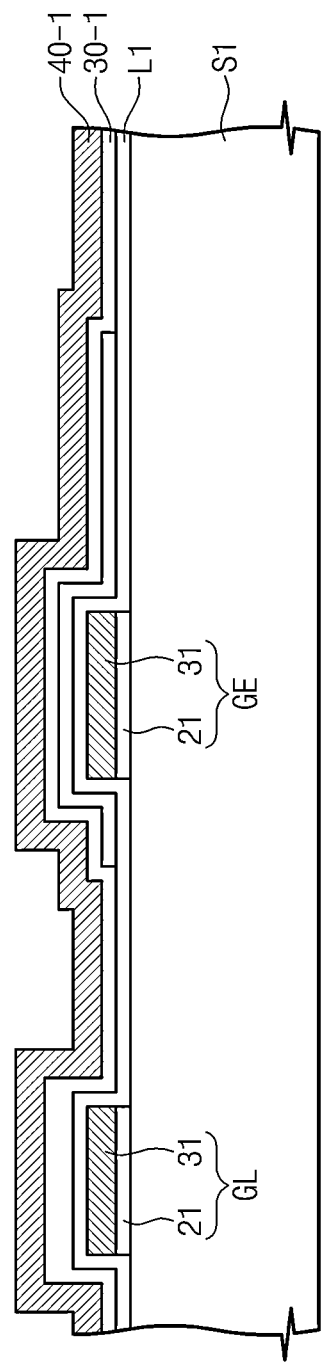

DISPLAY APPARATUS AND METHOD OF MANUFACTURING THE SAME

CROSS-REFERENCE TO RELATED APPLICATION

This application claims priority from and the benefit of Korean Patent Application No. 10-2013-0086197, filed on Jul. 22, 2013, which is hereby incorporated by reference for all purposes as if fully set forth herein.

BACKGROUND

1. Field

The present disclosure relates to a display apparatus and a method of manufacturing the same. More particularly, the present disclosure relates to a display apparatus including signal lines having a low resistance characteristic and a method of manufacturing the display apparatus.

2. Discussion of the Background

In general, a display apparatus includes a substrate, a pixel disposed on the substrate, and signal lines electrically connected to the pixel to apply signals to the pixel. The signal lines are formed of a metallic material, but the electrical resistance of the signal lines has increased as lengths of the signal lines have increased along with increased display areas of display apparatuses.

When the electrical resistance of the signal lines is high, the characteristics of the device may be less desirable due to the signals transmitted via the signal lines. More specifically, if the material for the signal lines has a higher resistance, it may not be appropriate for fast driving of modules implemented thereon (e.g., an RC time delay may occur due to a high resistance). Accordingly, copper having a relatively lower specific resistance has been used as a material to form the signal lines.

SUMMARY

The present disclosure provides a display apparatus including signal lines having a low resistance characteristic. The present disclosure also provides a method of manufacturing the display apparatus.

Additional aspects will be set forth in part in the description which follows and, in part, will be apparent from the description, or may be learned by practice of the presented embodiments.

According to exemplary embodiments, a display apparatus includes a base substrate, a data line to transmit a data signal, a gate line disposed on the base substrate and insulated from the data line, and a pixel electrically connected to the gate line and the data line via a thin film transistor.

At least one of the data line and the gate line includes a lower conductive layer including a zinc oxide doped with a doping material and an upper conductive layer disposed on the lower conductive layer and including a copper. The upper conductive layer includes crystals in which growth directions are dispersed by the doping material.

According to exemplary embodiments, a method of manufacturing a display apparatus is provided as follows. A gate line is formed on a base substrate, a data line is formed to be insulated from the gate line, and a pixel is formed to be electrically connected to the gate line and the data line via a thin film transistor. At least one of the gate line and the data line is formed by forming a lower conductive layer doped with a doping material and forming an upper conductive layer including a copper on the lower conductive layer. Growth directions of crystals contained in the upper conductive layer are dispersed by the doping material.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

FIG. 6A, FIG. 6B, FIG. 6C, and FIG. 6D are cross-sectional views showing a method of manufacturing the display apparatus shown in FIG. 2 according to an exemplary embodiment of the present invention.

DETAILED DESCRIPTION OF THE ILLUSTRATED EMBODIMENTS

Figure 1:
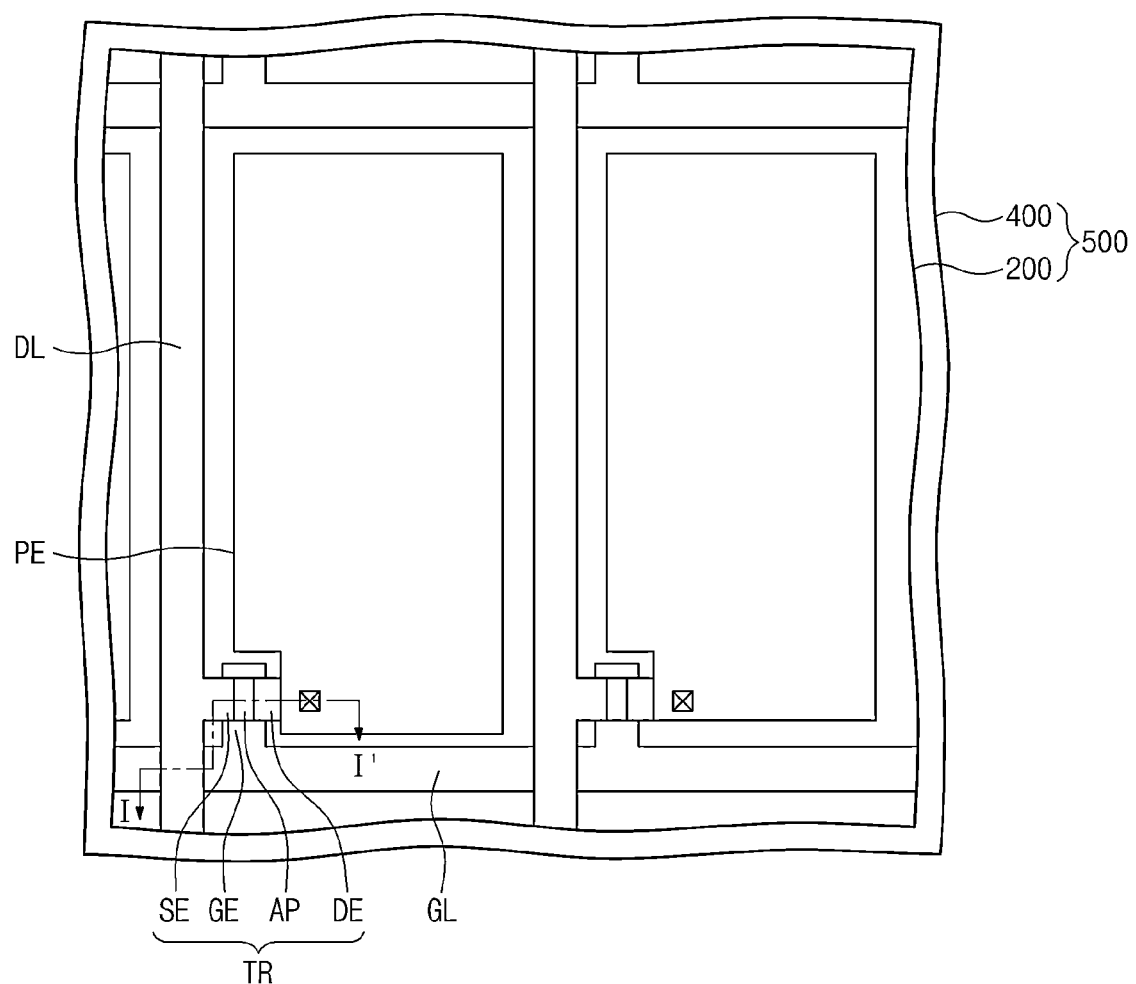
FIG. 1 is a plan view showing a display apparatus according to an exemplary embodiment of the present invention.

Exemplary embodiments now will be described more fully hereinafter with reference to the accompanying drawings, in which exemplary embodiments are shown. The present disclosure may, however, be embodied in many different forms and should not be construed as limited to the exemplary embodiments set forth therein. Rather, these exemplary embodiments are provided so that the present disclosure will be thorough and complete, and will fully convey the scope of the present disclosure to those skilled in the art. In the description, details of well-known features and techniques may be omitted to avoid unnecessarily obscuring the presented embodiments.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. When, however, an element or layer is referred to as being "directly on," "directly connected to," or "directly coupled to" another element or layer, there are no intervening elements or layers present. For the purposes of this disclosure, "at least one of X, Y, and Z"

and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
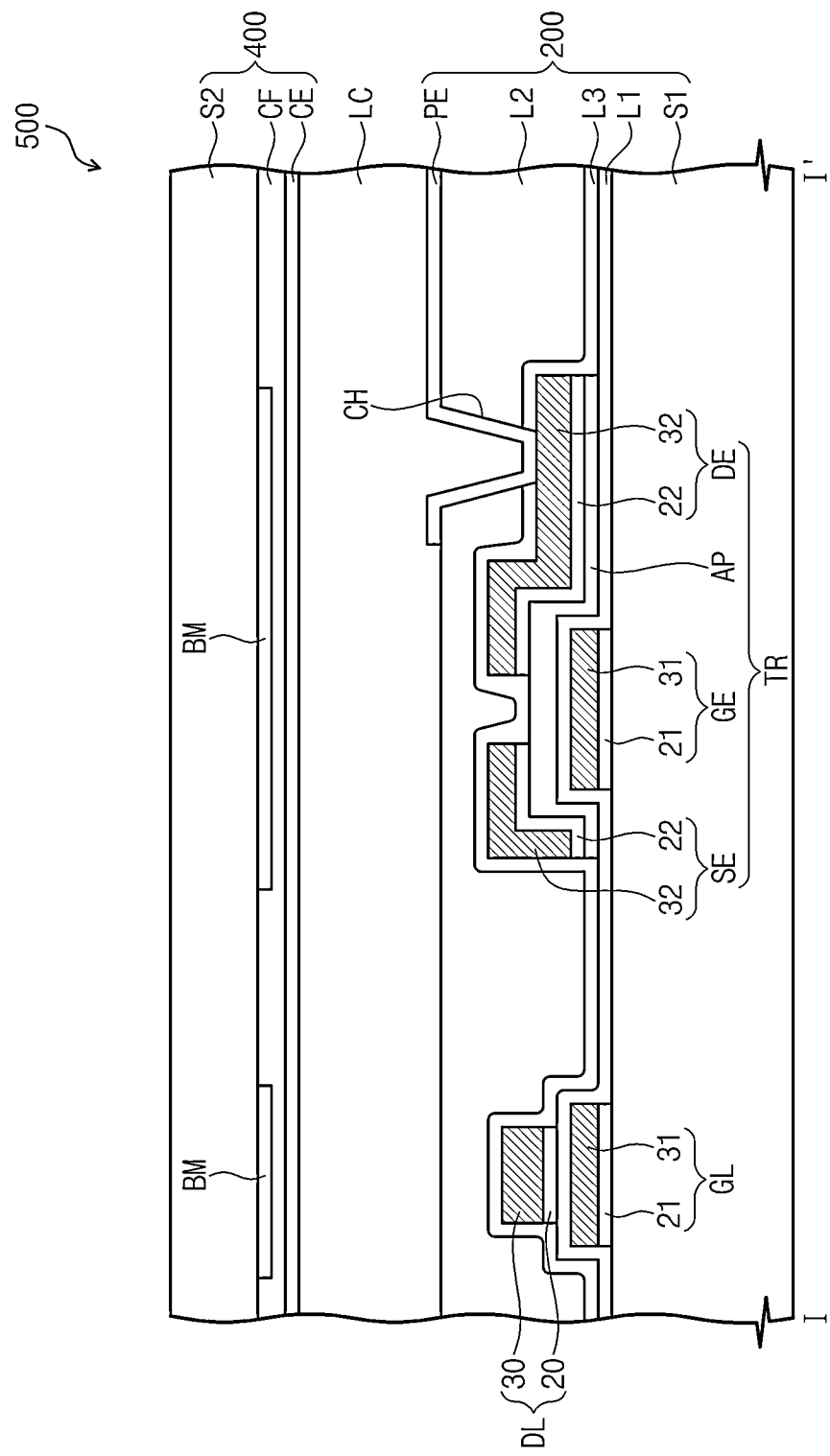
FIG. 2 is a cross-sectional view taken along a line I-I' shown in FIG. 1 according to an exemplary embodiment of the present invention.

FIG. 1 is a plan view showing a display apparatus according to an exemplary embodiment of the present invention, and FIG. 2 is a cross-sectional view taken along a line I-I' shown in FIG. 1 according to an exemplary embodiment of the present invention.

Referring to FIG. 1 and FIG. 2, an electronic apparatus, e.g., a display apparatus 500, may be, but not limited to, a liquid crystal display apparatus. In this case, the display apparatus 500 includes a first substrate 200, a second substrate 400, and a liquid crystal layer LC. The first and second substrates 200 and 400 face each other and the liquid crystal layer LC is interposed between the first and second substrates 200 and 400. Although not shown in FIG. 1 and FIG. 2, the display apparatus 500 may further include a backlight assembly (not shown) to emit light to the display apparatus 500, and the display apparatus 500 displays an image using the light.

The first substrate 200 includes a base substrate S1, a plurality of pixels, a plurality of gate lines, a plurality of data lines, and a plurality of thin film transistors. The pixels may include pixel electrodes, respectively. Hereinafter, one pixel electrode PE, one gate line GL, one data line DL, and one thin film transistor TR will be described in more detail. Thin film transistor TR may include planar type, staggered type, top gate type in which a gate electrode is formed above a source electrode and/or a drain electrode, a bottom gate type (e.g., an etch stopper type, and an etch back type), or the like.

The base substrate S1 may be a transparent insulating substrate, e.g., a glass substrate or a plastic substrate. If the base substrate S1 is the plastic substrate, the base substrate S1 may be a flexible substrate having flexibility and may include flexible material, such as polyimide, but is not limited thereto.

The gate line GL may be disposed on the base substrate S1 and electrically connected to the thin film transistor TR to transfer a gate signal to the thin film transistor TR.

A first insulating layer L1 may include silicon oxide and/or silicon nitride and may be disposed on the base substrate S1 to cover the gate line GL, and the data line DL may be disposed on the first insulating layer L1 and insulated from the gate line GL. The data line DL may be electrically connected to the thin film transistor TR to transfer a data signal. The data line DL may be disposed to cross the gate line GL when viewed in a plan view.

The thin film transistor TR may be electrically connected to the gate line GL, the data line DL, and the pixel electrode PE. When the thin film transistor TR is turned on in response to the gate signal, the data signal is applied to the pixel electrode PE. The thin film transistor TR includes a gate electrode GE, an active pattern AP, a source electrode SE, and a drain electrode DE.

The gate electrode GE is branched from the gate line GL. The active pattern AP may be disposed on the gate electrode GE while interposing the first insulating layer L1 therebetween. The active pattern AP may include a semiconductor material, e.g., an amorphous silicon, a crystalline silicon, etc., but it should not be limited thereto. For instance, the active pattern AP may include an oxide semiconductor material, such as IGZO, ZnO, $SnO_2$, $In_2O_3$, $Zn_2SnO_4$, $Ge_2O_3$, $HfO_2$, or a compound semiconductor material, such as GsAs, Gap, InP, etc.

The source electrode SE may be branched from the data line DL to contact the active pattern AP. The drain electrode DE may be spaced apart from the source electrode SE to contact the active pattern AP.

A third insulating layer L3 may include silicon oxide and/or silicon nitride and may be disposed on the first insulating layer L1 to cover the thin film transistor TR. A second insulating layer L2 may include an organic material and may be disposed on the third insulating layer L3. The pixel electrode PE may be disposed on the second insulating layer L2 and electrically connected to the drain electrode DE through a contact hole CH formed through the second insulating layer L2 and the third insulating layer L3.

The second substrate 400 may include an opposite substrate S2, a color filter CF, a black matrix BM, and a common electrode CE. The opposite substrate S2 may be a transparent insulating substrate, and the black matrix BM may be disposed on the opposite substrate S2 to correspond to the gate line GL, the data line DL, and the thin film transistor TR. In addition, the color filter CF may be disposed on the opposite substrate S2 to cover the black matrix BM and convert the light passing through the liquid crystal layer LC to a color, and the common electrode CE may be disposed on the color filter CF to generate an electric field in association with the pixel electrode PE, thereby controlling directors of liquid crystal molecules of the liquid crystal layer LC.

In another example, the common electrode CE may be disposed on the base substrate S1 to be spaced apart from the pixel electrode PE, and the color filter CF may be disposed on the base substrate S1 to correspond to the pixel electrode PE.

The data line DL may have a multi-layer structure. More specifically, the data line DL may include a lower conductive layer 20 and an upper conductive layer 30. The lower conductive layer 20 may be disposed on the first insulating layer L1 and the upper conductive layer 30 may be disposed on the lower conductive layer 20. The lower conductive layer 20 and the upper conductive layer 30 may have the same shape.

The upper conductive layer 30 includes copper. The upper conductive layer 30 has a thickness larger than that of the lower conductive layer 20. For instance, the upper conductive layer 30 has the thickness of about 200 nm to about 1200 nm and the lower conductive layer 20 has a thickness of about 10 nm to about 50 nm. Therefore, a part of the upper conductive layer 30 in the data line DL is thicker or greater than that of the lower conductive layer 20, and thus the data line DL has the specific resistance approximate to that of the copper even though the specific resistance of the lower conductive layer 20 is higher than that of the copper.

Further, the lower conductive layer 20 may include zinc oxide doped with a doping material, e.g., aluminum, boron, molybdenum, and/or magnesium. The lower conductive layer 20 may provide several functions and/or effects, e.g., first and second effects on the upper conductive layer 30. As the first effect, a direction to which the crystals of the upper conductive layer 30 grow is diversified. More specifically, the growth direction of the crystals of the upper conductive layer 30 is scattered from the (111) direction to a different direction from the (111) direction. Growth directions of crystals contained in the upper conductive layer 30 may be dispersed by the doping material when the upper conductive layer 30 is formed on the lower conductive layer 20. As the second effect, an average diameter of crystals of the upper conductive layer 30 is reduced.

As described above, since such functions and/or effects, e.g., the first and second effects, are provided on the upper conductive layer 30 by the lower conductive layer 20, the upper conductive layer 30 is formed on the lower conductive layer 20 to relieve a step difference on an upper surface of the lower conductive layer 20 even though the lower conductive layer 20 has the step difference on the upper surface thereof. In particular, if the step difference is generated by a foreign substance in the lower conductive layer 20, the relief of the step difference in the upper conductive layer 30 may be improved by the lower conductive layer 20. Thus, the upper conductive layer 30 may be prevented from being cracked due to the step difference of the lower conductive layer 20 or the defect may be reduced. The crack may cause a gate-drain short problem, thus the reduction of the cracks may also reduce such problems.

A weight ratio of the doping material to zinc oxide in the lower conductive layer 20 may be in a range from about 2:98 to about 10:90. When the lower conductive layer 20 includes zinc oxide doped with aluminum, the weight ratio of aluminum to zinc oxide in the lower conductive layer 20 is in the range from 2:98 to 10:90. If the weight ratio of aluminum in the lower conductive layer 20 is less than about 2%, the first and second effects may not be likely to occur or may be negligible, and if the weight ratio of aluminum in the lower conductive layer 20 exceeds about 10~11%, a hillock, in which protrusions are formed on the surface of the lower conductive layer 20, occurs, which is caused by aluminum that is thermally expanded at a high temperature when the lower conductive layer 20 is formed.

Further, since the data line DL includes the lower conductive layer 20, a third effect, in which the lower conductive layer 20 prevents copper atoms of the upper conductive layer 30 from being diffused, occurs.

However, if the signal line has a single-layer structure containing copper without having the lower conductive layer 20, the copper atoms of the signal line may be diffused to the layer disposed under the signal line. Since the third effect occurs by the lower conductive layer 20, the copper atoms of the upper conductive layer 30 may be prevented from being diffused to the layer disposed under the signal line by the lower conductive layer 20. This will be described in more detail with reference to FIG. 3B.

As described above, the thickness of the lower conductive layer 20 is in the range from about 10 nm to about 50 nm. The upper conductive layer 30 may be thicker than the lower conductive layer 20 and may be thicker than e.g., 200 nm. Since it is difficult to form the lower conductive layer 20 with the thickness less than about 10 nm, a minimum of the thickness of the lower conductive layer 20 may be about 10 nm. However, the thickness of the lower conductive layer 20 may be less than about 10 nm in certain implementations. In addition, when the thickness of the lower conductive layer 20 exceeds about 50 nm, the first and second effects occur, but a surface resistance of the data line DL may be increased.

In more detail, when the thickness of the lower conductive layer 20 is in the range from about 10 nm to about 50 nm, the surface resistance of the data line DL is in a range from about 45 mΩ/cm$^2$ to about 55 mΩ/cm$^2$. However, as the thickness of the lower conductive layer 20 increases over about 50 nm, the surface resistance of the data line DL becomes about 70 mΩ/cm$^2$ that is a surface resistance of the data line formed of aluminum with a specific resistance about 1.6 times greater than that of copper. Thus, when the thickness of the lower conductive layer 20 exceeds about 50 nm, the surface resistance of the data line DL formed of copper is not greatly reduced as compared to that of the data line formed of aluminum even though the data line DL is formed of copper.

The lower conductive layer 20 of the data line DL contacts the first insulating layer L1. Accordingly, when the first insulating layer L1 is the silicon oxide layer, an adhesive intensity of the layer including zinc oxide with respect to the silicon oxide layer is greater than that of the layer including copper, and thus adhesive force between the data line DL and the first insulating layer L1 may be improved by the lower conductive layer 20.

Figure 3A:
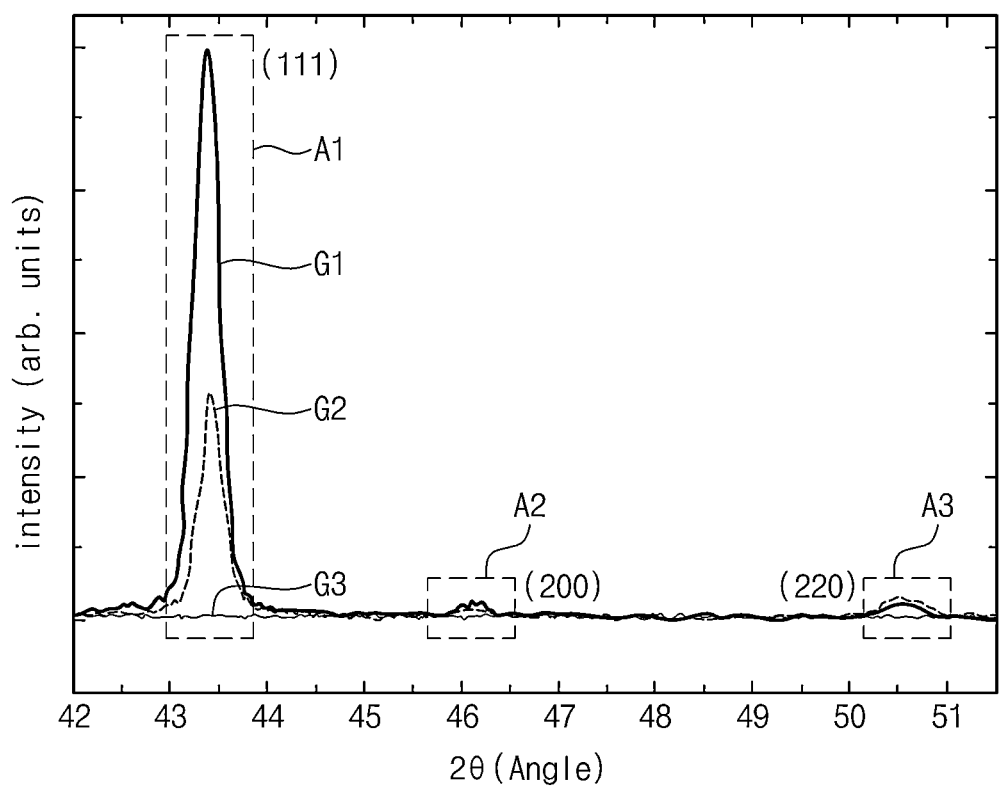
FIG. 3A and FIG. 3B are graphs showing effects of the display apparatus according to an exemplary embodiment of the present invention.
Figure 3B:
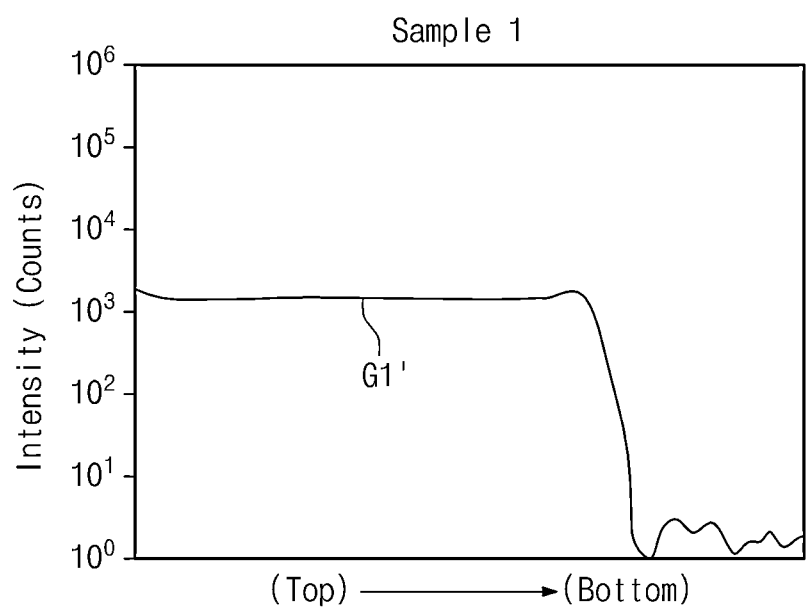
Figure 3B:
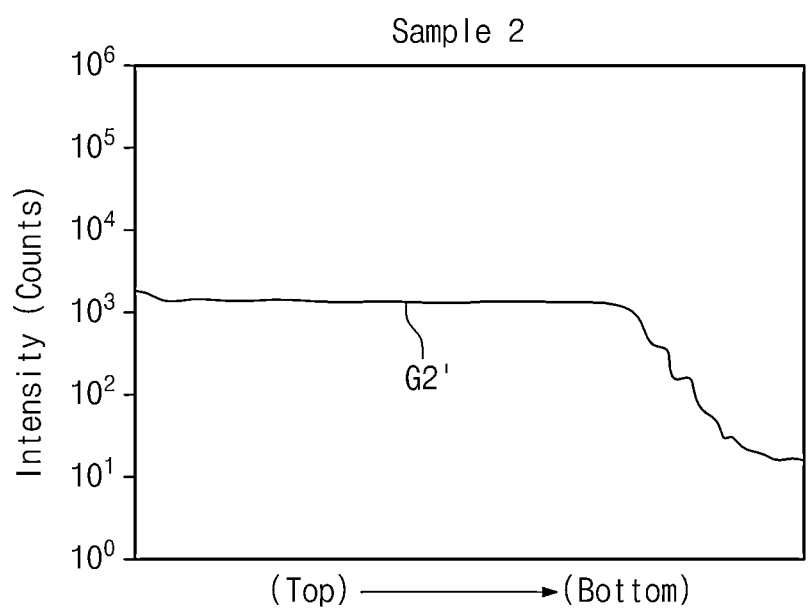

FIG. 3A and FIG. 3B are graphs showing effects of the display apparatus according to an exemplary embodiment of the present invention. More specifically, FIG. 3A is a graph showing the first effect and FIG. 3B is a diagram showing the third effect.

Referring to FIG. 3A, a first graph G1 shows a direction in which crystals of the data line grow, which corresponds to a first sample shown in Table 1, a second graph G2 shows a direction in which crystals of the data line grow, which corresponds to a second sample shown in Table 1, and a third graph G3 shows a direction in which crystals of the data line grow, which corresponds to a third sample shown in Table 1.

TABLE 1

| Sample number | Structure of data line | Materials for data line | |
|---|---|---|---|
| 1 | Single-layer | Cu (500 nm) | First compared example |
| 2 | Double-layer | Al (20 nm)(lower conductive layer)/ Cu (500 nm) (upper conductive layer) | Second compared example |
| 3 | Double-layer | AZO (40 nm) (lower conductive layer)/ Cu (500 nm) (upper conductive layer) | Embodied example |

The data line according to the first sample, e.g., the first compared example, has the single-layer structure of copper, and the data line according to the second sample, e.g., the second compared example, has the double-layer structure of the lower conductive layer containing aluminum and the upper conductive layer containing copper and disposed on the lower conductive layer. The data line according to the third sample, e.g., one of the embodied examples, has the double-layer structure of the lower conductive layer containing zinc oxide doped with aluminum and the upper conductive layer containing copper and disposed on the lower conductive layer. The structure of the data line corresponding to the third sample may be the same as that of the data line DL (refer to FIG. 2) described with reference to FIG. 1 and FIG. 2.

In the first to third graphs G1 to G3, a horizontal axis indicates an angle corresponding to 2-theta value, which corresponds to a sum of an angle of an x-ray incident into a sample and an angle of the x-ray reflected by the sample, according an x-ray diffraction analysis, and a vertical axis indicates a relative intensity of detected peaks. The intensity of the peak is proportional to the number of the crystals grown in the (111) direction when the 2-theta is from about 43 degrees to about 44 degrees. In addition, the intensity of the peak is proportional to the number of the crystals grown in the (200) direction when the 2-theta is from about 45.5 degrees to about 46.5 degrees. Further, the intensity of the peak is proportional to the number of the crystals grown in the (220) direction when the 2-theta is from about 50 degrees to about 51 degrees in a third section A3.

When intensities of the peaks of the first to third graphs G1 to G3 are compared with each other in the first section A1, the peak of the first graph G1 is strongest, the peak of the third graph G3 is weakest, and the peak of the second graph G2 is weaker than that of the first graph G1 and stronger than that of the third graph G3. In each of the second and third sections A2 and A3, the peak of the first graph1 G1 is stronger than that of the third graph G3, and the peak of the second graph G2 is stronger than that of the third graph G3.

That is, the intensities of the peaks of the first graph G1 and the second graph G2 are remarkably increased in the first section A1, and somewhat increased in the second section A2 and the third section A3. However, the intensity of the peak of the third graph G3 is uniform regardless of the first to third sections A1 to A3 and the 2-theta value. It means that the crystals of the first and second samples tend to be strongly grown in the (111) direction, the (200) direction, and the (220) direction more than the crystals of the third sample. Therefore, the crystals of the first and second samples, which are grown in the (111) direction, the (200) direction, and the (220) direction, may have a polycrystalline structure and an anisotropic structure. On the other hand, the crystals of the third sample may have an amorphous structure and an isotropic structure or may be closer to the amorphous structure and the isotropic structure than the first and second samples.

Referring to FIG. 3B, a first graph G1' shows the degree of diffusion of copper contained in the upper conductive layer to the lower conductive layer in the data line corresponding to a first sample shown in Table 2, and a second graph G2' shows the degree of diffusion of copper contained in the upper conductive layer to the lower conductive layer in the data line corresponding to a second sample shown in Table 2. More specifically, the x-axis of each of the first graph G1' and the second graph G2' indicates a depth of the lower conductive layer, which is from an upper surface of the lower conductive layer toward a bottom surface of the lower conductive layer, and the y-axis of each of the first graph G1' and the second graph G2' indicates the number of copper atoms in the lower conductive layer.

TABLE 2

| Sample number | Structure of data line | Materials for data line | |
|---|---|---|---|
| 1 | Double-layer | AZO (40 nm)(lower conductive layer)/ Cu (500 nm) (upper conductive layer) | Embodied example |
| 2 | Double-layer | Al (20 nm) (lower conductive layer)/ Cu (500 nm) (upper conductive layer) | Compared example |

The first sample of Table 2, e.g., an embodied example, has the structure of the data line, and the second sample has the structure of the data line according to a compared example. More specifically, the data line corresponding to the first sample includes the lower conductive layer containing zinc oxide doped with aluminum and the upper conductive layer containing copper, and the data line corresponding to the second sample includes the lower conductive layer containing aluminum and the upper conductive layer containing copper. The data line corresponding to the first sample may have the same structure as that of the data line DL described with reference to FIG. 1 and FIG. 2.

According to the first graph G1' and the second graph G2', the number of the copper atoms diffused to the bottom surface of the lower conductive layer of the first sample is smaller than the number of the copper atoms diffused to the bottom surface of the lower conductive layer of the second sample. It means that the portion of the copper atoms may be diffused to the other layer disposed under the lower conductive layer since the copper atoms are not completely blocked by the lower conductive layer containing aluminum when the data line has the structure according to the compared example (the sample 2 of Table 2). However, when the data line has the structure having a disposed data line DL (refer to FIG. 2) according to the embodied example (the sample 1 of Table 2), the copper atoms are prevented from being diffused to the other layer or reduced number of the copper atoms are diffused to the other layer since the copper atoms of the upper conductive layer 30 (refer to FIG. 2) are more effectively blocked by the lower conductive layer 20 (refer to FIG. 2).

Referring to FIG. 2 again, as the data line DL has the multi-layer structure of the lower conductive layer 20 and the upper conductive layer 30, which are sequentially stacked one on another, each of the gate electrode GE, the source electrode SE, the drain electrode DE, and the gate line GL may have the multi-layer structure.

More specifically, the gate line GL and the gate electrode GE may be formed through the same patterning process, and thus each of the gate line GL and the gate electrode GE includes a first lower conductive layer 21 and a first upper conductive layer 31, which are sequentially stacked. The first lower conductive layer 21 may include the same material as the lower conductive layer 20 and the first upper conductive layer 31 may include the same material as the upper conductive layer 30.

The source electrode SE and the drain electrode DE may be formed through the same patterning process to have the same structure, so that each of the source electrode SE and the drain electrode DE includes a second lower conductive layer 22 and a second upper conductive layer 32. The second lower conductive layer 22 may include the same material as the lower conductive layer 20 and the second upper conductive layer 32 may include the same material as the upper conductive layer 30. Thus, the first, second, and third effects may occur when the gate electrode GE, the source electrode SE, the drain electrode DE, and the gate line GL are formed. Further, the second lower conductive layer 22 may include the same material as the first lower conductive layer 210 and the second upper conductive layer 32 may include the same material as the first upper conductive layer 31. However, aspects are not limited as such.

Figure 4:
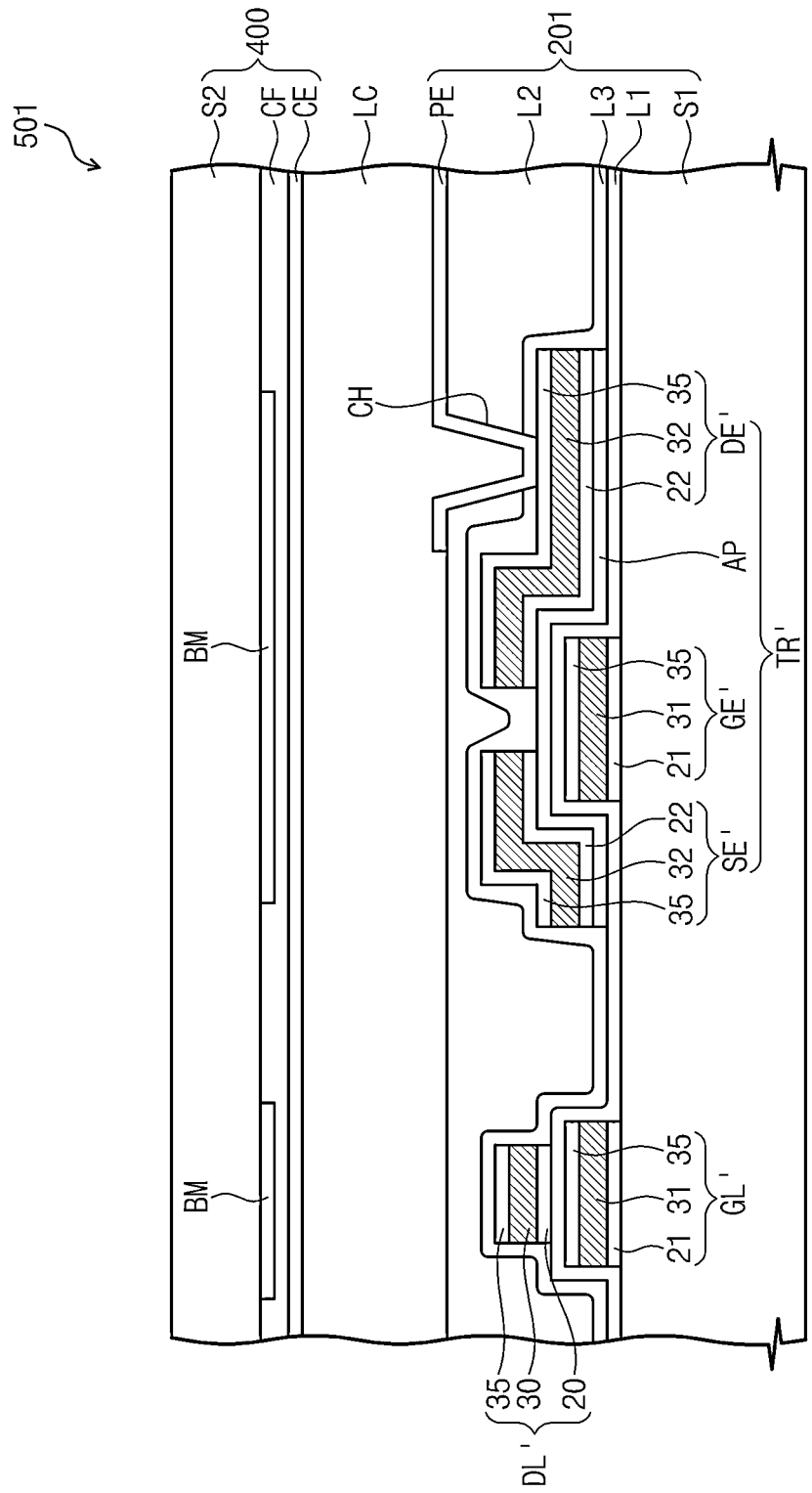
FIG. 4 is a cross-sectional view showing a display apparatus according to another exemplary embodiment of the present invention.

FIG. 4 is a cross-sectional view showing a display apparatus according to another exemplary embodiment of the present invention. In FIG. 4, the same reference numerals denote the same elements in FIG. 1 and FIG. 2, and thus detailed descriptions of the same elements will be omitted.

Referring to FIG. 4, a display apparatus 501 includes a first substrate 201, a second substrate 400, and a liquid crystal layer LC. When the first substrate 201 shown in FIG. 1 is compared with the first substrate 200 of FIG. 2, each of a gate line GL', a data line DL', a gate electrode GE', a source electrode SE', and a drain electrode DE' further includes an uppermost conductive layer 35. The uppermost conductive layer 35 is disposed on the upper conductive layer 30, the first upper conductive layer 31, and the second upper conductive layer 32. Further, the uppermost conductive layer 35 disposed on the upper conductive layer 30 may include the same material (or a different material) in comparison with the uppermost conductive layer 35 disposed on the upper conductive layer 31 or the uppermost conductive layer 35 disposed on the upper conductive layer 32.

The uppermost conductive layer 35 may include zinc oxide doped with at least one of aluminum, boron, magnesium, and molybdenum. Thus, during the manufacturing of the first substrate 201, the gate line GL', the data line DL', the gate electrode GE', the source electrode SE', and the drain electrode DE' may be prevented from being oxidized or the oxidization may be reduced by the uppermost conductive layer 35 when they are exposed to the outside environment.

Figure 5:
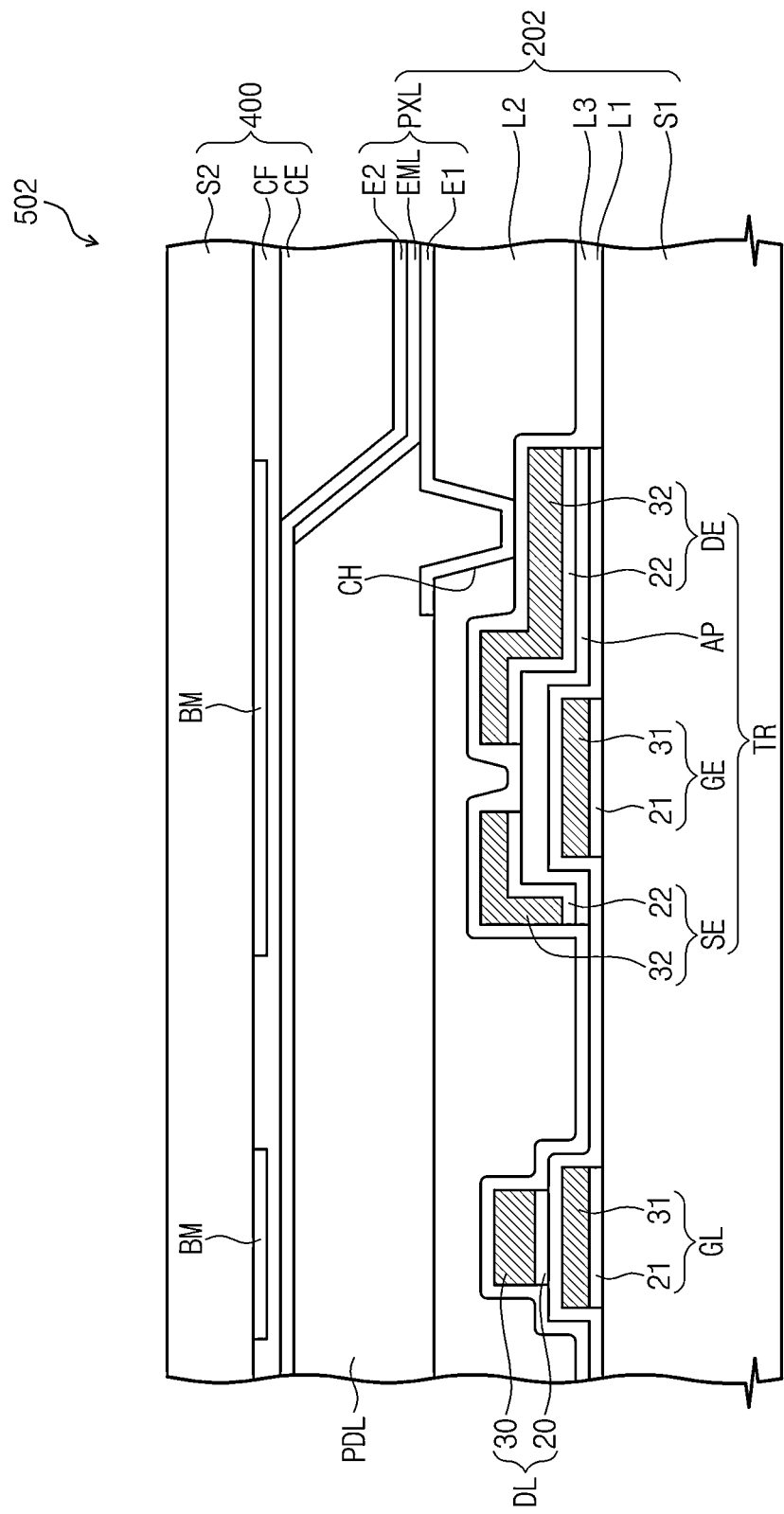
FIG. 5 is a cross-sectional view showing a display apparatus according to another exemplary embodiment of the present invention.

FIG. 5 is a cross-sectional view showing a display apparatus according to another exemplary embodiment of the present invention. In FIG. 5, the same reference numerals denote the same elements in the above-mentioned exemplary embodiment, and thus detailed descriptions of the same elements will be omitted.

Referring to FIG. 5, a display apparatus 502 is an organic electroluminescent display apparatus and includes a first substrate 202 and a second substrate 400.

The first substrate 202 includes a pixel PXL, and the pixel PXL includes a first electrode E1 electrically connected to a thin film transistor TR, an organic light emitting layer EML disposed on the first electrode E1, and a second electrode E2 disposed on the organic light emitting layer EML.

The first substrate 202 may further include a pixel definition layer PDL disposed on a second insulating layer L2. The pixel definition layer PDL is provided with an opening formed therethrough, and thus the organic light emitting layer EML contacts the first electrode E1 through the opening.

The organic light emitting layer EML may have a single-layer structure and the organic light emitting layer EML emits a white light. Further, the organic light emitting layer EML may include a plurality of sub-organic light emitting layers (not shown) spaced apart from each other to emit lights of multiple colors.

FIG. 6A, FIG. 6B, FIG. 6C, and FIG. 6D are cross-sectional views showing a method of manufacturing the display apparatus shown in FIG. 2 according to an exemplary embodiment of the present invention. In FIG. 6A to FIG. 6D, the same reference numerals denote the same elements in FIG. 2, and thus detailed descriptions of the same elements will be omitted.

Referring to FIG. 6A and FIG. 6B, a first preliminary conductive layer 21-1 and a second preliminary conductive layer 31-1 are formed on the base substrate S1. The first and second preliminary conductive layers 21-1 and 31-1 may be successively formed on the base substrate S1 using a sputtering method. The first preliminary conductive layer 21-1 may include zinc oxide doped with at least one of aluminum, magnesium, boron, and molybdenum, and the second preliminary conductive layer 31-1 may include copper.

Then, the first and second preliminary conductive layers 21-1 to 31-1 are etched to form the first lower conductive layer 21 and the first upper conductive layer 31 for each of the gate lines GL and the gate electrode GE. More specifically, the gate line GL and the gate electrode GE, each including the first lower conductive layer 21 and the first upper conductive layer 31, may be formed by the etching. The first and second preliminary conductive layers 21-1 and 31-1 may be substantially simultaneously etched using an etchant, e.g., nitric acid, hydrochloric acid, sulfuric acid, etc.

If the first preliminary conductive layer 21-1 includes titanium instead of zinc oxide, hydrofluoric acid may be required to etch the first preliminary conductive layer 21-1. In this case, since it is difficult to etch the first and second preliminary conductive layers 21-1 and 31-1 using hydrofluoric acid, the first and second preliminary conductive layers 21-1 and 31-1 are etched by using different etchants. However, since the first preliminary conductive layer 21-1 may include zinc oxide without including the titanium, the first and second preliminary conductive layers 21-1 and 31-1 may be substantially simultaneously etched using nitric acid, hydrochloric acid, or sulfuric acid.

Meanwhile, the foreign substance may be entered into between two adjacent layers among the base substrate S1, the first lower conductive layer 21, and the first upper conductive layer 31 while the first and second preliminary conductive layers 21-1 and 31-1 are formed and/or the first and second conductive layers 21 and 31 are formed. For instance, the foreign substance may be inadvertently added between the first lower conductive layer 21 and the first upper conductive layer 31. In this case, the first upper conductive layer 31 is required to cover the step difference caused by the foreign substance.

Because of the characteristics of the first lower conductive layer 21, the first and second effects may occur on the first upper conductive layer 31 by the first lower conductive layer 21. Thus, the foreign substance may be better covered by the first upper conductive layer 31 and the first lower conductive layer 21. This will be described in detail with reference to FIG. 7A and FIG. 7B.

Figure 6D:
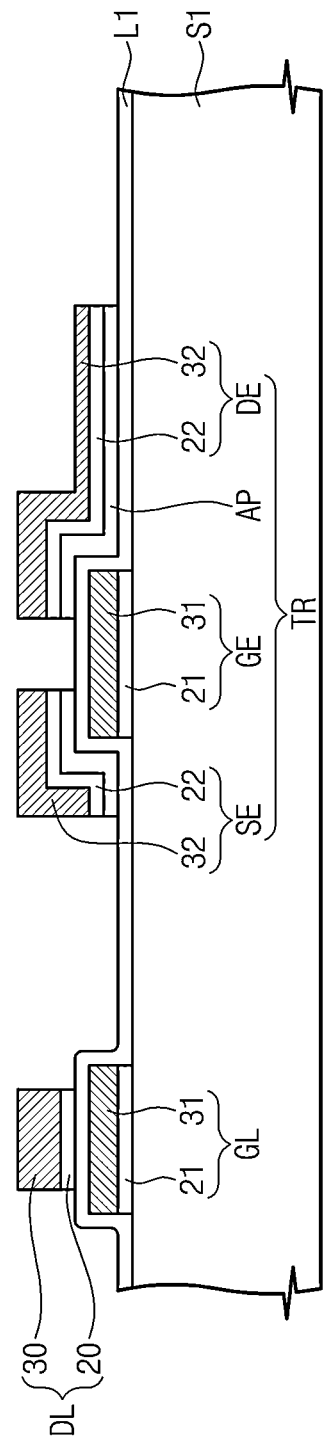

Referring to FIG. 6C and FIG. 6D, the first insulating layer L1 is formed to cover the gate line GL and the gate electrode GE, and the active pattern AP is formed on the first insulating layer L1 to overlap with the gate electrode GE.

After that, a third preliminary conductive layer 30-1 and a fourth preliminary conductive layer 40-1 are sequentially formed on the first insulating layer L1. The third preliminary conductive layer 30-1 may include zinc oxide doped with at least one of aluminum, magnesium, boron, and molybdenum and the fourth preliminary conductive layer 40-1 may include copper.

Then, the third and fourth preliminary conductive layers 30-1 to 40-1 are patterned to form the lower conductive layer 20, the upper conductive layer 30, the second lower conductive layer 22, and the second upper conductive layer 32, thereby forming the data line DL, the source electrode SE, and the drain electrode DE. The third and fourth preliminary conductive layers 30-1 and 40-1 may be substantially simultaneously formed using an etchant, e.g., nitric acid, hydrochloric acid, sulfuric acid, etc.

In addition, the foreign substance may be entered into between two adjacent layers among the first insulating layer L1, the lower conductive layer 20, and the upper conductive layer 30 while the lower and upper conductive layers 20 and 30 are formed. For instance, the foreign substance may be inadvertently added between the lower conductive layer 20 and the upper conductive layer 30. In this case, as described above, the first and second effects may occur on the upper conductive layer 30 by the lower conductive layer 20. Thus, the foreign substance may be better covered by the upper conductive layer 30 and/or the lower conductive layer 20.

Further, the third effect occurs on the second lower conductive layer 22, and thus the second lower conductive layer 22 may block the copper atoms diffused toward the active pattern AP from the source electrode SE and from the drain electrode DE. Therefore, the driving characteristics of the thin film transistor TR may be prevented from being deteriorated due to the copper atoms.

Referring to FIG. 2, after the thin film transistor TR is formed, the third insulating layer L3 may be formed and the second insulating layer L2 may be formed on the third insulating layer L3. Then, the contact hole CH may be formed through the second and third insulating layers L2 and L3 to expose the drain electrode DE, and the pixel electrode PE is formed to contact the drain electrode DE through the contact hole CH, thereby manufacturing the first substrate 200.

Then, the second substrate 400 may be manufactured, and the first substrate 200 and the second substrate 400 are coupled to each other while interposing the liquid crystal layer LC therebetween, thereby completing the display apparatus 500.

Figure 7A:
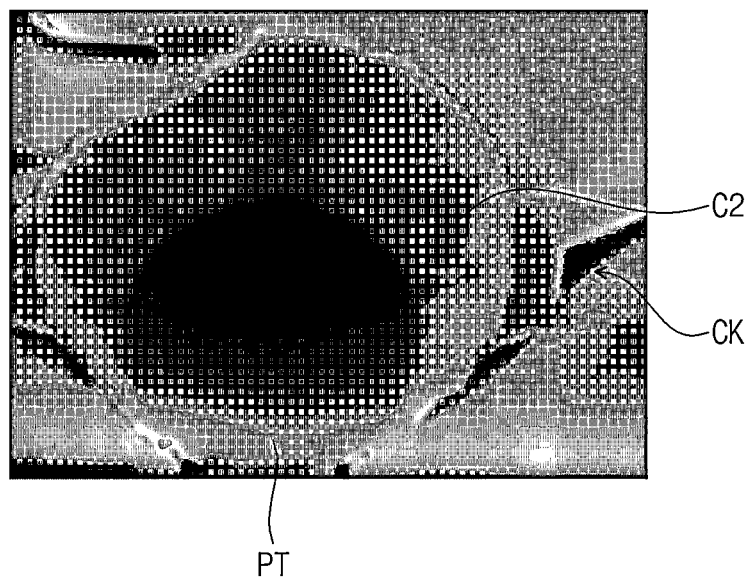
FIG. 7A is a photograph showing a cross-sectional view of data lines having a crack formed while a foreign substance exists.
Figure 7B:
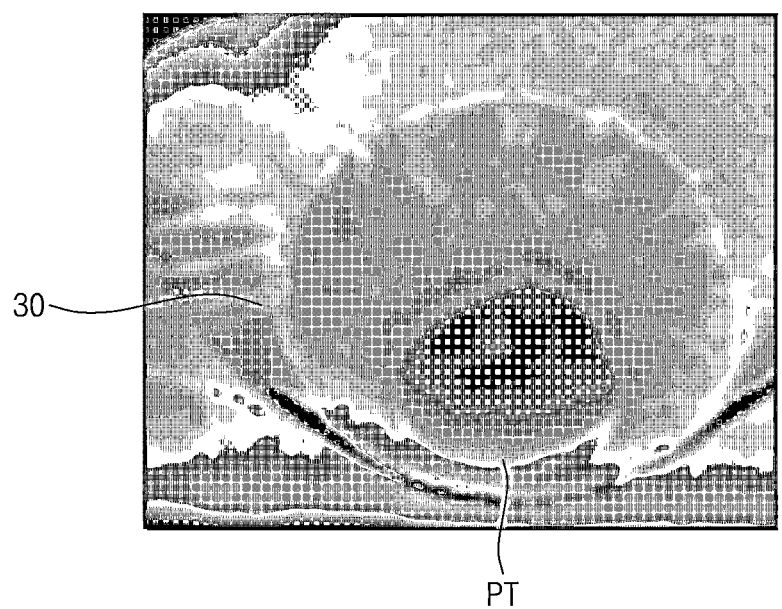
FIG. 7B is a photograph showing a cross-sectional view of data lines while a foreign substance exists, according to an exemplary embodiment of the present invention.

FIG. 7A is a photograph showing a cross-sectional view of data lines having a crack formed while a foreign substance exists. FIG. 7B is a photograph showing a cross-sectional view of data lines while a foreign substance exists, according to an exemplary embodiment of the present invention. More specifically, FIG. 7B shows a cross-section of the data line having the structure corresponding to the embodied sample, e.g., the third sample shown in Table 1.

Referring to FIG. 7A, the data line includes a lower conductive layer containing titanium and an upper conductive layer C2 containing copper and the upper conductive layer C2 covers the foreign substance PT. In this case, the crystals of the upper conductive layer C2 tend to be strongly grown in the (111) direction, the (200) direction, and the (220) direction, and thus the crystals of the upper conductive layer C2 has the anisotropic property rather than the isotropic property. As a result, the upper conductive layer C2 does not completely cover the foreign substance PT, so that a crack CK occurs on the upper conductive layer C2 due to the step difference caused by the foreign substance PT.

In this case, defects may occur on the upper conductive layer C2 by the crack CK. More specifically, the etchant used to pattern another conductive layer on the upper conductive layer C2 infiltrates into the crack CK. Thus, the foreign substance PT and a cover portion of the upper conductive layer C2, which covers the foreign substance PT, are separated from the data line.

Referring to FIG. 7B, the upper conductive layer 30 covers the foreign substance PT. In this case, as described above, since the first and second effects occur on the upper conductive layer 30 by the lower conductive layer 20 (refer to FIG. 2) disposed under the upper conductive layer 30, the crystals of the upper conductive layer 30 has the isotropic property rather than the anisotropic property. Therefore, the covering characteristic of the upper conductive layer 30 against the foreign substance PT may be improved.

As a result, the crack may be prevented from occurring on the upper conductive layer 30, which is caused by the step difference due to the foreign substance PT. In addition, although the crack occurs due to the foreign substance PT, the upper conductive layer 30 may cover the crack since the covering characteristics of the upper conductive layer 30 are improved. Thus, the defects of the upper conductive layer 30 may be prevented, which may be caused by the etchant infiltrated into the crack.

According to the above, the growth directions of the crystals contained in the upper conductive layer including the copper are dispersed by the lower conductive layer of the data line, and a size of the crystals is reduced. Thus, although a foreign substance enters into the data line while the data line is formed, a step difference caused by the foreign substance is covered by the upper conductive layer and defects may be prevented from occurring on the data line, thereby improving a manufacturing yield of the display apparatus.

In addition, the lower conductive layer prevents the copper of the upper conductive layer from being diffused. Accordingly, copper atoms of the upper conductive layer may be prevented from being diffused to other layers disposed under the data line by the lower conductive layer. Therefore, defects may be prevented from occurring on the other layers, which are caused by the diffusion of the copper atoms.

Although certain exemplary embodiments and implementations have been described herein, other embodiments and modifications will be apparent from this description. Accordingly, the invention is not limited to such embodiments, but rather to the broader scope of the presented claims and various obvious modifications and equivalent arrangements.

What is claimed is:

1. A display apparatus comprising:
   a base substrate;
   a data line to transmit a data signal, the data line being electrically connected to a source electrode of a transistor;
   a gate line disposed on the base substrate and insulated from the data line, the gate line being electrically connected to a gate electrode of the transistor; and
   a pixel electrically connected to a drain electrode of the transistor, wherein at least one of the data line and the gate line comprises:
      a lower conductive layer comprising a zinc oxide doped with a doping material; and
      an upper conductive layer disposed on the lower conductive layer and comprising a copper, the upper conductive layer comprising crystals in which growth directions are dispersed by the doping material.

2. The display apparatus of claim 1, wherein the growth directions of the crystals contained in the upper conductive layer are dispersed to directions different from a (111) direction by the doping material.

3. The display apparatus of claim 1, wherein the doping material comprises at least one of aluminum, magnesium, molybdenum, and boron.

4. The display apparatus of claim 3, wherein a weight ratio of the doping material to the zinc oxide in the lower conductive layer is in a range from 2:98 to 10:90.

5. The display apparatus of claim 4, wherein the lower conductive layer has a thickness of about 10 nm to about 50 nm and the data line has a surface resistance of about 45 mΩ/cm² to about 55 mΩ/cm².

6. The display apparatus of claim 1, wherein at least one of the gate line and the data line further comprises an uppermost conductive layer disposed on the lower conductive layer, the upper conductive layer being disposed between the uppermost conductive layer and the lower conductive layer.

7. The display apparatus of claim 6, wherein the uppermost conductive layer comprises the zinc oxide doped with at least one of aluminum, boron, magnesium, and molybdenum.

8. The display apparatus of claim 1, further comprising the thin film transistor electrically connected to the gate line, the data line, and the pixel, wherein at least one of the gate line and the data line has a multi-layer structure of the lower conductive layer and the upper conductive layer, which are sequentially stacked, and the thin film transistor comprises an electrode having the multi-layer structure.

9. The display apparatus of claim 8, further comprising:
an opposite substrate facing the base substrate;
a common electrode disposed on the base substrate or the opposite substrate; and
a liquid crystal layer interposed between the base substrate and the opposite substrate, wherein the pixel comprises a pixel electrode electrically connected to the thin film transistor.

10. The display apparatus of claim 8, wherein the pixel comprises:
a first electrode electrically connected to the thin film transistor;
an organic light emitting layer disposed on the first electrode; and
a second electrode disposed on the organic light emitting layer.

11. The display apparatus of claim 1, wherein the lower conductive layer reduces a diffusion of the copper contained in the upper conductive layer across the lower conductive layer.

12. A method of manufacturing a display apparatus, comprising:
forming a gate line on a base substrate the gate line being electrically connected to a gate electrode of a transistor;
forming a data line, the data line being insulated from the gate line, the data line being electrically connected to a source electrode of the transistor; and
forming a pixel electrically connected to a drain electrode of the transistor, wherein at least one of the gate line and the data line is formed by:
forming a lower conductive layer doped with a doping material; and
forming an upper conductive layer on the lower conductive layer, the upper conductive layer comprising a copper,
wherein growth directions of crystals contained in the upper conductive layer are dispersed by the doping material.

13. The method of claim 12, wherein the doping material comprises at least one of aluminum, magnesium, molybdenum, and boron, and the lower conductive layer is formed by doping a zinc oxide with the doping material.

14. The method of claim 13, wherein the growth directions of the crystals contained in the upper conductive layer are dispersed to directions different from a (111) direction by the doping material when the upper conductive layer is formed on the lower conductive layer.

15. The method of claim 13, wherein a weight ratio of the doping material to the zinc oxide in the lower conductive layer is in a range from 2:98 to 10:90.

16. The method of claim 15, wherein the lower conductive layer has a thickness of about 10 nm to about 50 nm.

17. The method of claim 12, wherein at least one of the forming of the gate line and the forming of the data line further comprises forming an uppermost conductive layer on the upper conductive layer, and the uppermost conductive layer is formed by doping a zinc oxide with at least one of aluminum, boron, magnesium, and molybdenum.

18. The method of claim 12, further comprising forming the thin film transistor electrically connected to the gate line, the data line, and the pixel, wherein at least one of the gate line and the data line is formed to have a multi-layer structure of the lower conductive layer and the upper conductive layer, which are sequentially stacked, and the thin film transistor comprises an electrode having the multi-layer structure.

19. The method of claim 12, wherein the lower conductive layer reduces a diffusion of the copper contained in the upper conductive layer across the lower conductive layer.

20. The method of claim 12, wherein at least one of the forming of the gate line and the forming of the data line further comprises:
forming a first preliminary conductive layer on the base substrate; and
forming a second preliminary conductive layer on the first preliminary conductive layer, and the first preliminary conductive layer and the second preliminary conductive layer are etched using the same etchant to respectively form the lower conductive layer and the upper conductive layer.

* * * * *